US012613471B2

(12) United States Patent
König

(10) Patent No.: US 12,613,471 B2
(45) Date of Patent: Apr. 28, 2026

(54) METHOD FOR MANUFACTURING A SENSOR DEVICE

(71) Applicant: TDK Corporation, Tokyo (JP)

(72) Inventor: Matthias König, Munich (DE)

(73) Assignee: TDK Corporation, Tokyo (JP)

( * ) Notice: Subject to any disclaimer, the term of this patent is extended or adjusted under 35 U.S.C. 154(b) by 532 days.

(21) Appl. No.: 16/951,894

(22) Filed: Nov. 18, 2020

(65) Prior Publication Data

US 2021/0157246 A1 May 27, 2021

(30) Foreign Application Priority Data

Nov. 25, 2019 (DE) .......................... 102019131824.6

(51) Int. Cl.
| | |
|---|---|
| *G03F 7/00* | (2006.01) |
| *G03F 1/38* | (2012.01) |
| *G03F 1/70* | (2012.01) |

(52) U.S. Cl.
CPC ............ *G03F 7/70466* (2013.01); *G03F 1/38* (2013.01); *G03F 1/70* (2013.01)

(58) Field of Classification Search
CPC ........... G03F 7/70466; G03F 1/38; G03F 1/70
See application file for complete search history.

(56) References Cited

U.S. PATENT DOCUMENTS

| | | | |
|---|---|---|---|
| 4,958,514 A * | 9/1990 | Takami | ................... G01N 27/12 |
| | | | 338/34 |
| 5,880,552 A * | 3/1999 | McGill | .............. G01N 29/2462 |
| | | | 310/313 R |

(Continued)

OTHER PUBLICATIONS

B. Min, et al.., "SnO2 thin film gas sensor fabricated by ion beam deposition," Elsevier, Sensors and Actuators B 98, Oct. 14, 2003, 8 pages.

(Continued)

*Primary Examiner* — Jonathan Johnson
*Assistant Examiner* — Jayson D Cosgrove
(74) *Attorney, Agent, or Firm* — Slater Matsil, LLP

(57) ABSTRACT

In an embodiment a method includes providing a substrate with an electrical functional layer comprising a plurality of functional regions, wherein the functional regions are electrically addressable independently from each other, wherein the plurality of functional regions comprises at least a first group of functional regions and a second group of functional regions, wherein the first group is different from the second group, and wherein at least one functional region is part of the first group and of the second group and performing a multiple-mask process by applying a first mask on the electrical functional layer, wherein the first mask exposes the functional regions of the first group and covers all other functional regions, applying a first sensor material over the exposed functional regions by sputtering, removing the first mask, applying a second mask on the electrical functional layer, wherein the second mask exposes the functional regions of the second group and covers all other functional regions, applying a second sensor material over the exposed functional regions by sputtering and/or performing a functionalizing treatment in the exposed functional regions and removing the second mask.

20 Claims, 14 Drawing Sheets

(56) References Cited

U.S. PATENT DOCUMENTS

| 2015/0158052 | A1* | 6/2015 | Latev | B06B 1/0622 |
| | | | | 156/60 |
| 2017/0356869 | A1* | 12/2017 | Koenig | G01N 27/121 |
| 2018/0205041 | A1* | 7/2018 | Baisl | H10K 71/00 |
| 2019/0161347 | A1* | 5/2019 | Classen | B81C 1/00301 |

OTHER PUBLICATIONS

"Datasheet SGP30 Sensirion Gas Platform," www.sensirion.com, Version 0.92, Apr. 2019, 18 pages.
L. Filipovic, et al., "Review-System-on-Chip SMO Gas Sensor Integration in Advanced CMOS Technology," Journal of the Electrochemical Society, 165 (16), Dec. 15, 2018, 19 pages.
SGX Sensortech: "The MiCS-6814 is a compact MOS sensor with three fully independent sensing elements on one package", Data Sheet, MiCS-6814, 1143 rev 8, https://www.sgxsensortech.com/content/uploads/2015/02/1143_Datasheet-MiCS-6814-rev-8.pdf <https://www.sgxsensortech.com/content/uploads/2015/02/1143_Datasheet-MiCS-6814-rev-8.pdf, 5 pages.
W. Tao, et al., "H2S sensing properties of noble metal doped WO3 thin film sensor fabricated by micromachining," Elsevier, Sensors and Actuators B 81 (2002), Sep. 10, 2001, 11 pages.

* cited by examiner

METHOD FOR MANUFACTURING A SENSOR DEVICE

CROSS-REFERENCE TO RELATED APPLICATIONS

This application claims priority to German Patent Application No. 102019131824.6, filed on Nov. 25, 2019, which application is hereby incorporated herein by reference.

TECHNICAL FIELD

Embodiments of the present invention are related to a method for manufacturing a sensor device, in particular a sensor device comprising the functionalities of a gas sensor.

BACKGROUND

There are more and more applications for miniaturized sensors, for example, in smartphones. Such sensors typically have a human counterpart, as for instance eyes/camera, ears/microphone, sense of touch/touchscreen, sense of balance/gyroscope. However, the sense of smelling is usually not realized in smartphones.

Furthermore, miniaturized gas sensors often provide only the possibility to detect one gas species rather than a plurality of different gas species. The manufacture of miniaturized gas sensors that can detect various gas species requires a great effort, in particular if highly integrated gas sensors with the ability to detect multiple gas species should be produced.

SUMMARY

Embodiments provide a method for manufacturing a sensor device, in particular a sensor device that comprises the functionalities of a gas sensor.

According to at least one embodiment, a method for manufacturing a sensor device comprises a method step A, wherein method step A comprises providing a substrate with an electrical functional layer. The electrical functional layer comprises a plurality of functional regions. In a method step B, which is a multiple-mask process, at least a first sensor material is applied to a first group of functional regions using a first mask, and, using a second mask, at least a second material is applied to a second group of functional regions and/or a functionalizing treatment is performed in the functional regions of the second group of functional regions. That a sensor material is applied to a functional region means in particular that the sensor material is applied to the functional layer in the functional region.

According to a further embodiment, a sensor device comprises a substrate with an electrical functional layer, wherein the electrical functional layer comprises a plurality of functional regions. At least a first sensor material is arranged on a first group of functional regions and at least a second sensor material is arranged to a second group of functional regions and/or a functionalization is present in the functional regions of the second group of functional regions. The functional regions preferably form sensor elements of the sensor device. The description before and in the following equally applies to the method for manufacturing the sensor device and to the sensor device.

The sensor device is preferably a so-called metal-oxide sensor comprising one or more sensor materials with or being made of one or more semiconducting metal oxides. Thus, at least one sensor material that is applied in method step B comprises or consists of a semiconducting metal oxide, such as, for instance, one or more selected from $SnO_x$, $WO_x$, $ZnO_x$, $TiO_x$, $CuO_x$. Preferably, all sensor materials of the sensor device, i.e., all sensor materials that are applied in method step B, comprise or consist of a semiconducting metal oxide. In principle, semiconducting metal oxides can be used for gas detection. For instance, in the presence of oxygen, for example in air, at elevated temperatures, for example between 150° C. and 400° C., oxygen can be adsorbed at the surface of the semiconducting metal oxide. Due to electron trapping effects in the semiconducting metal oxide, which are caused by the oxygen absorbance, the electrical resistance of the semiconducting metal oxide changes. Usually, for n-type materials the electrical resistance increases and for p-type materials the electrical resistance decreases. The occurrence of a target gas in the atmosphere in contact with the semiconducting metal oxide, which can react with the adsorbed oxygen or directly with the semiconducting metal oxide, can cause a change of the electrical resistance of the semiconducting metal oxide, which can be measured as a sensor signal. The magnitude of the resistance change can be correlated to the concentration of the target gas.

Preferably, the sensor materials applied in step B, which can be the first sensor material and/or the second sensor material and/or any further sensor materials in addition to the first and/or second sensor material, are different to each other. Different sensor materials can preferably provide different sensitivities to different gas molecules, for instance in terms of different molecule types and/or different molecule sizes. That sensor materials are different to each other can particularly mean that the sensor materials differ in terms of material and/or amount. Different amounts of sensor materials can, in particular, imply that the sensor materials are applied with different thicknesses. Different thicknesses of a sensor material applied to different functional regions can, for example, offer the possibility to separate molecules by their activation energy, since a thicker sensor material layer can, for instance, provide more time to interact and to reach the combustion temperature of a certain gas species. Different materials of sensor materials can, in particular, imply that the sensor materials have different components and/or a different compositions. Different materials can, in particular, provide different sensitivities to different gas species.

According to a further embodiment, the first sensor material and/or the second sensor material and, preferably, every sensor material is applied to the functional layer by sputtering. Compared to usual deposition techniques for applying a metal-oxide based sensor material, which are ink-based dispensing techniques, sputtering has several advantages. Compared to dispensing techniques, sputtering not only is less cost-intensive, but also allows for covering smaller structures, so that, compared to methods based on dispensing techniques, miniaturization and device shrinkage are possible when using sputtering. Furthermore, while ink-based sensor materials usually have to be tempered at high temperatures after the deposition, in principle no sintering is required after a sputter process, so that an electronic component, which, for instance, can provide a possibility to address the functional regions and which would be harmed by the tempering, can be arranged on the substrate before the sensor material is applied. Furthermore, compared to dispensing processes sputtering processes are usually more reliable from batch to batch, so that no calibration or at least less efforts in regard to a calibration is needed. Moreover, compared to ink-based dispensing processes it is possible to deposit a greater variety of materials by sputtering, since not every material that can be sputtered can also be deposited as ink. It is also easily possible to stack several layers of different materials by sputtering, for instance including a diffusion barrier for larger molecules so that a higher sensitivity for smaller molecules can be achieved. Also, due to the absence of solvents and stabilizers that are needed in ink-based processes there is less residual dirt in sputtering processes.

According to a further embodiment, the substrate is based on silicon or is made of silicon. The electrical functional layer, also denoted in short as "functional layer" in the following, is applied to the substrate. Preferably, processing steps performed in regard to the substrate and in regard to the functional layer are based on standard MEMS (micro-electromechanical systems) technology. In other words, at least the manufacture and/or the patterning of the functional layer or of at least one component thereof, like for example heater elements and/or electrical contacts, and/or the processing of the substrate, for instance in regard to patterning the substrate, can be performed by using process techniques known from MEMS technology. Accordingly, particularly preferably the electrical functional layer is manufactured and/or patterned using MEMS technology. Consequently, the sensor device can be based on MEMS technology, thereby providing small dimensions and a high degree of integration.

For instance, the electrical functional layer is provided as a continuous layer on the substrate in method step A and the substrate and/or the electrical functional layer is patterned in a method step C after method step B. Preferably, at least a part of the electrical functional layer can be formed as a membrane in method step C. As described before, forming the functional layer as membrane is preferably performed by using process steps based on MEMS technology.

According to a further embodiment, the functional layer comprises a plurality of heater elements, wherein each of the heater elements is assigned to a functional region. That a heater element is assigned to a functional region can in particular mean that the heater element can heat the assigned functional region during operating of the sensor device. In particular, during operation of the sensor device, every functional region, which defines a sensor element of the sensor device, is heatable by a heater element. For instance, every functional region can comprise its individually assigned heater element. Alternatively, the electrical functional layer comprises a common heater element that is assigned to more than one functional region or to all functional regions, so that more than one or all functional regions can be heated by the common heater element. Each of the one or more heater elements of the sensor device can preferably be embodied as a heating resistance, in particular, in the form of a heating layer, heating filament or heating wire. Preferably, the one or more heater elements of the sensor device comprise or are made of a noble metal as for example Pt. Other metals, for example W, are also possible in addition or alternatively. Furthermore, a silicon resistor, for instance comprising polycrystalline silicon, is also possible for a heater element.

The functional layer can further comprise a layer with an electrically insulating material or made of an electrically insulating material, for instance comprising or being made of one or more oxides and/or nitrides as, for example, silicon oxide, silicon nitride and/or aluminum oxide. The one or more heater elements of the sensor device can preferably be embedded in the electrically insulating material.

According to a further embodiment, the functional regions of the electric functional layer are electrically addressable independently from each other. In other words, for each of the functional regions and, thus, for each sensor element in the finished sensor device, an electrical signal can be measured independently from the other functional regions. The functional layer preferably comprises electrical contacts for measuring an electrical resistance of sensor material applied to a functional region. In particular, at least one or more or preferably each of the functional regions comprises electrical contacts which are in electrical contact with a sensor material in the respective functional region, so that the electrical resistance of the sensor material of each of the functional regions can be measured independently from the other functional regions. Sensor material applied to a functional region in method step B can, preferably, be deposited on the functional layer and, particularly preferably, in direct contact with electrical contacts of the respective functional region. In case each functional region comprises its individual heater element, preferably also the heater elements can be operated independently from each other via electrical contacts. Consequently, the functional layer preferably comprises electrical contacts for operating the one or more heater elements of the functional layer.

According to a further embodiment, the plurality of functional regions comprises at least a first group of functional regions and a second group of functional regions, wherein the first group is different from the second group. This means that not all functional regions which belong to the first group are also part of the second group and/or that not all functional regions which belong to the second group are also part of the first group. Consequently, two groups of functional regions are different if at least one group comprises a functional region that is not part of the other group. Furthermore, at least one functional region is part of the first group and part of the second group. Consequently, the first and the second group have at least one functional region in common and at least one other functional region is only part of one of the first and second group. By way of example, the first group and/or the second group and/or any further group of functional regions comprises less than a total number of functional regions, for instance a quarter or a third or, preferably, a half or even more than a half of the total number of functional regions.

According to a further embodiment, the multiple-mask process of method step B comprises the steps of applying a first mask on the electrical functional layer, wherein the first mask exposes the functional regions of the first group and covers all other functional regions, applying a first sensor material to the exposed functional regions of the first group, and removing the first mask. Consequently, after the removal of the first mask only the functional regions of the first group are provided with the first sensor material.

According to a further embodiment, method step B comprises the steps of applying a second mask on the electrical functional layer, wherein the second mask exposes the functional regions of the second group and covers all other functional regions, applying a second sensor material to the exposed functional regions of the second group and/or performing a functionalizing treatment in the exposed functional regions of the second group, and removing the second mask. Consequently, after the removal of the second mask only the functional regions of the second group are covered with the second sensor material or have received a functionalizing treatment.

Since at least one functional group is part of both the first group and the second group, this at least one functional group is covered by the first sensor material and the second sensor material or is covered by the first sensor material and has received the functionalizing treatment, whereas at least one other functional region is only covered by the first material and/or at least one other functional region is only covered by the second material or has only received the functionalizing treatment. Consequently, the sensor device comprises at least two functional regions that have different gas sensing properties, so that, depending on the sensor materials and treatments, the sensor device can for instance be used to detect different gas species. Each functional region with at least one sensor material applied thereon can form a sensor element of the sensor device, so that the sensor element can comprise a plurality of different sensor elements, i.e., a plurality of sensor elements which can be used to detect different gas species. If every sensor element is denoted as "pixel", the sensor device can therefore be denoted as multi-pixel gas sensor.

The first mask and/or the second mask and/or any further mask applied during method step B is a mask suitable for applying a sensor material and/or performing a functionalizing treatment. When a sensor material is applied, the used mask is in particular suitable for sputtering the sensor material. For instance, each of the masks can comprise a photoresist that is applied as continuous layer on the functional layer and that can patterned afterwards, for instance by lithography. Alternatively or additionally, one or more masks used in method step B can be metal masks.

According to a further embodiment, the functionalizing treatment comprises one or more of the following steps: providing a functionalizing material, providing a catalyst material, providing a filter material, performing reactive sputtering, performing an oxidation step. The functionalizing treatment can alter the properties of a sensor material so that the sensitivity to certain molecules types and/or molecule sizes can be adjusted. For instance, a functionalizing material can be provided by evaporation or sputtering. The functionalizing material can comprise at least one metal selected from Pt, Cu and Ag. Preferably, the functionalizing material is applied with a thickness of equal to or less than 200 nm or of equal to or less than 100 nm or of equal to or less than 50 nm or of equal to or less than 20 nm. Such thin layers can tend to form clusters rather than forming a smooth layer, wherein the cluster size and shape depend on the thickness. Thus, depending on the applied thickness differently functionalized surfaces of sensor material to which the functionalizing material is applied can be achieved. For instance, the functionalizing material can form a filter for certain molecule sizes. Alternatively or additionally, a catalyst material is provided by evaporation or sputtering or is provided by co-sputtering in combination with applying a sensor material by sputtering. For example, it is possible to dope a sensor material with a layer comprising at least one material selected from Pt, Cu, CuO. These materials can work as catalysts and can change the sensitivity of the sensor material. Reactive sputtering can lead to different compositions and/or surface properties of the sensor material. In case of an oxidation step, plasma-oxidation and/or heat-induced oxidation, for instance in an oven, can be performed.

Preferably, more than two masks are used in method step B, wherein in connection with each of the masks another group of functional regions is exposed. For example, the plurality of functional regions comprises at least a third group of functional regions, the third group being different from the first group and from the second group, respectively, wherein, in method step B, a third mask is applied on the electrical functional layer, the third mask exposing the functional regions of the third group and covering all other functional regions, a third sensor material is applied to the exposed functional regions of the third group by sputtering and/or a functionalizing treatment is performed in the exposed functional regions of the third group, and the third mask is removed. Preferably, at least one of the functional regions of the third group is part of the first group and/or at least one of the functional regions of the third group is part of the second group. This implies that at least one functional region of the third group can also be part of both the first and second group.

Furthermore, the plurality of functional regions can comprise one or more further groups, each of the further groups being different from all other groups. Preferably, in method step B, for each further group of the one or more further groups a further mask is applied on the electrical functional layer, the further mask exposing the functional regions of the further group and covering all other functional regions, a further sensor material is applied to the exposed functional regions of the further group by sputtering and/or a functionalizing treatment is performed in the exposed functional regions of the further group, and the further mask is removed. Preferably, at least one of the functional regions of at least one of the one or more further groups is part of another group.

According to a further embodiment, before method step B, the substrate is provided with at least one electronic component configured to address the functional regions and, thus, the sensor elements of the sensor device, during operation of the sensor service. For instance, the at least one electronic component comprises at least one CMOS (complementary metal-oxide-semiconductor) device. In particular, in method step B the at least one electronic component is covered by at least one or more or all of the masks applied on the electrical functional layer. As mentioned above, depositing the sensor materials by sputtering provides the advantage that no high-temperature post-processing as tempering of the sensor material is necessary, which could harm the at least one electronic component, so that the at least one electronic component can be arranged on the substrate before any sensor material is deposited. The at least one electronic component and/or necessary conductor lines for addressing the functional regions can be produced, in particular, by MEMS technology on the substrate so that a high degree of integration can be achieved.

In the method described herein various functional regions can be part of different groups of functional regions. Since preferably in connection with every group a different sensor material is applied and/or a different functionalizing treatment is performed, it is possible to achieve different combinations of sensor materials and functionalizing treatments in the various functional regions by assigning the functional regions to different groups and group combinations. Consequently, different sensor elements being different gas sensor types can be created in the functional regions without using an individual mask for every different gas sensor type. For example, it is possible to dope a group of functional regions, which comprise different sensor materials, in a single mask-based step with a catalyst material, while another group of functional regions with said different sensor materials remains undoped, so that the number of different sensor types can for instance be doubled by using only one mask. Preferably, the number of created different sensor elements forming different gas sensor types is exponentially growing with the number of masks used in method step B. Thus, it is possible to end up with a number of different sensor types which is higher than the number of masks that are used to produce the sensor types. Consequently, a multi-pixel sensor device can be manufactured, wherein preferably every pixel is formed by a sensor element comprising a respective functional region and wherein each sensor element forms a sensor type different from the other pixels of the sensor device. As described above, the individual pixels, i.e., the individual sensor elements, are processed so that their individual characteristic behavior is manipulated by process steps that a commonly performed to several different pixels.

BRIEF DESCRIPTION OF THE DRAWINGS

Further features, advantages and expediencies will become apparent from the following description of exemplary embodiments in conjunction with the figures.

FIGS. 1A to 1K schematically illustrate method steps of a method for manufacturing a sensor device according to an embodiment;

DETAILED DESCRIPTION OF ILLUSTRATIVE EMBODIMENTS

Figure 1A:
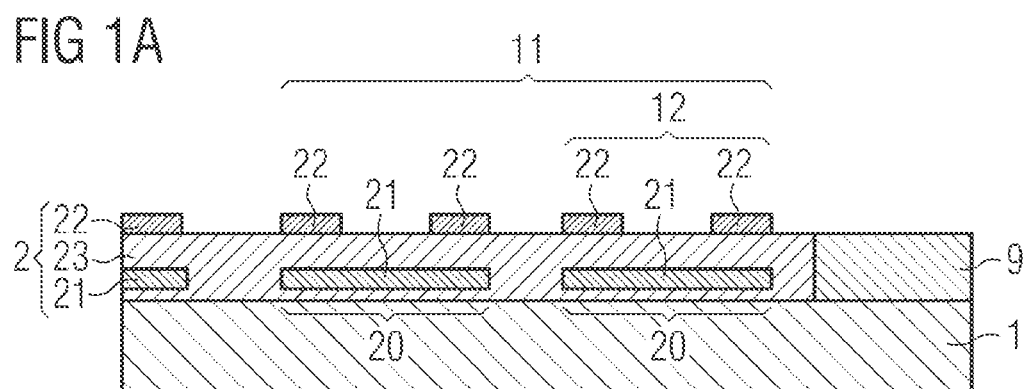

In the figures, elements of the same design and/or function are identified by the same reference numerals. It is to be understood that the embodiments shown in the figures are illustrative representations and are not necessarily drawn to scale.

Figure 1B:
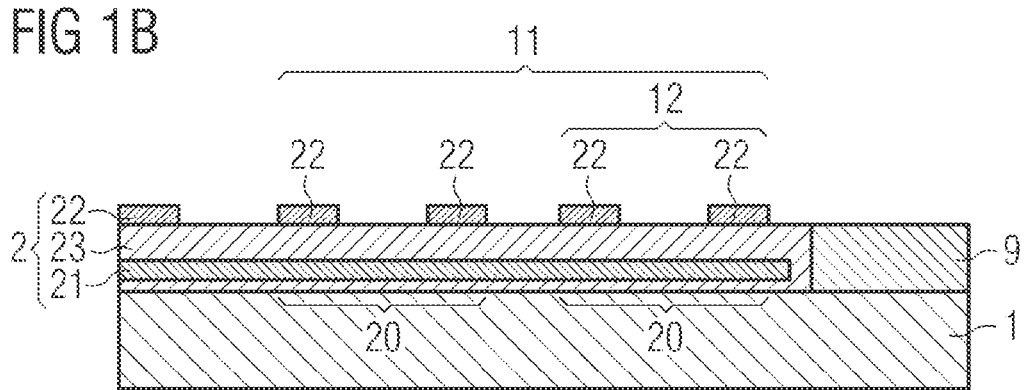
Figure 1C:
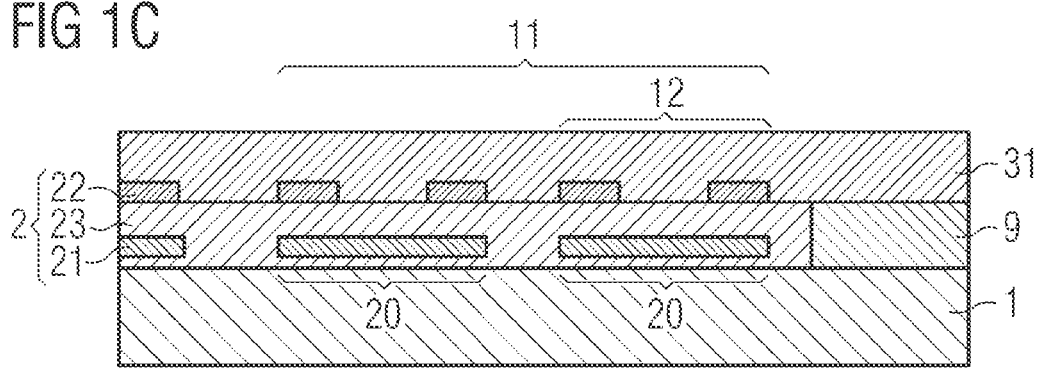
Figure 1D:
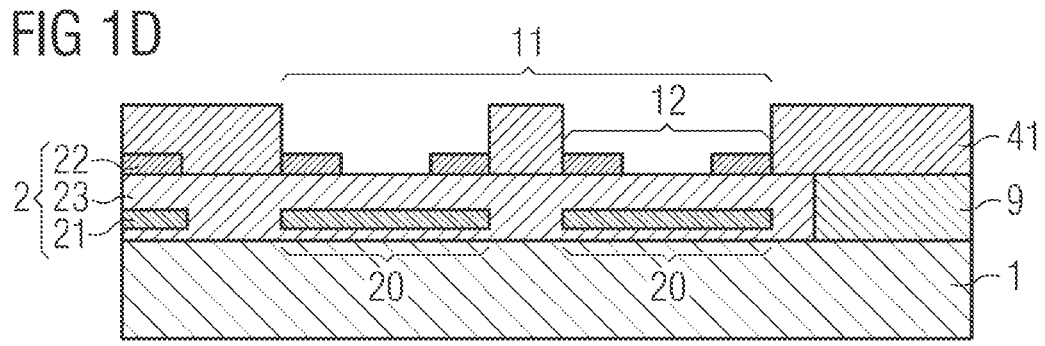
Figures 1E, 1F, 1G, 1H:
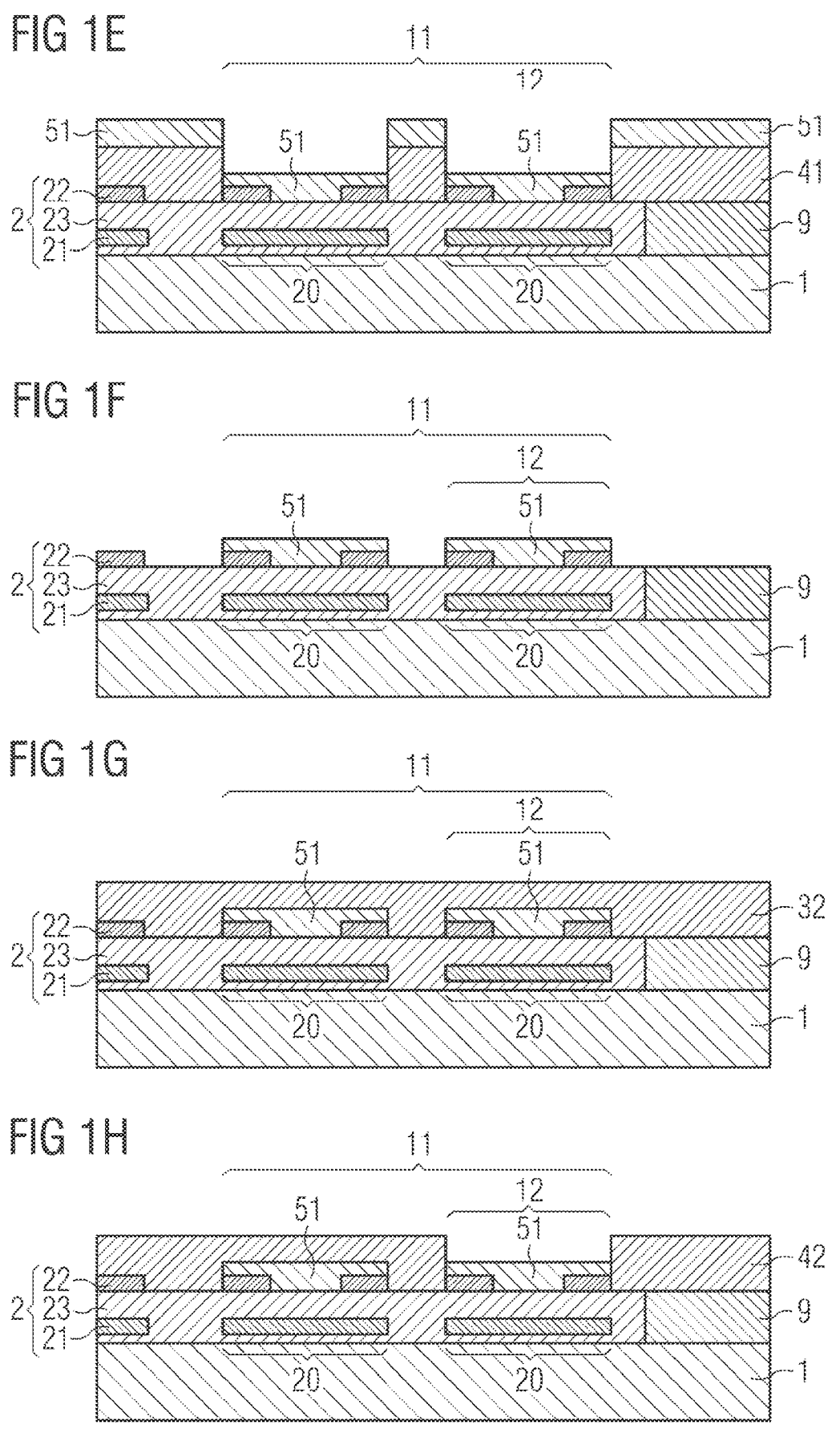
Figure 1I:
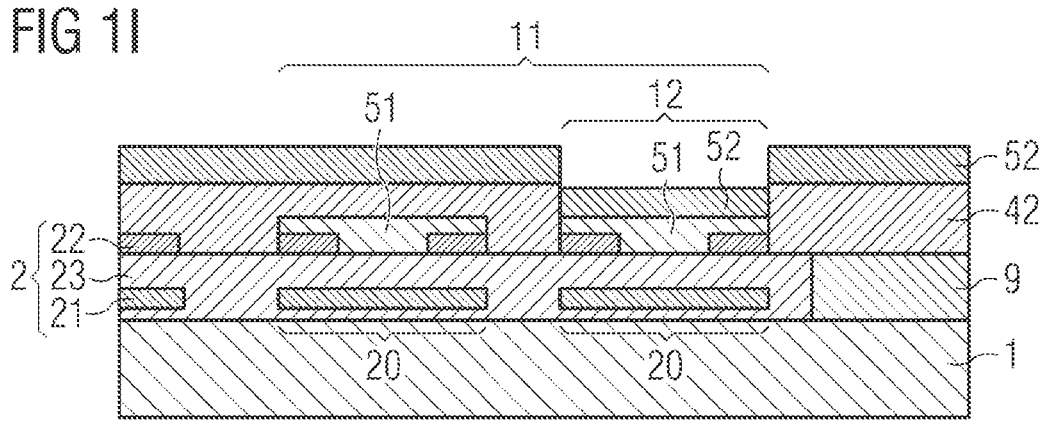
Figure 1J:
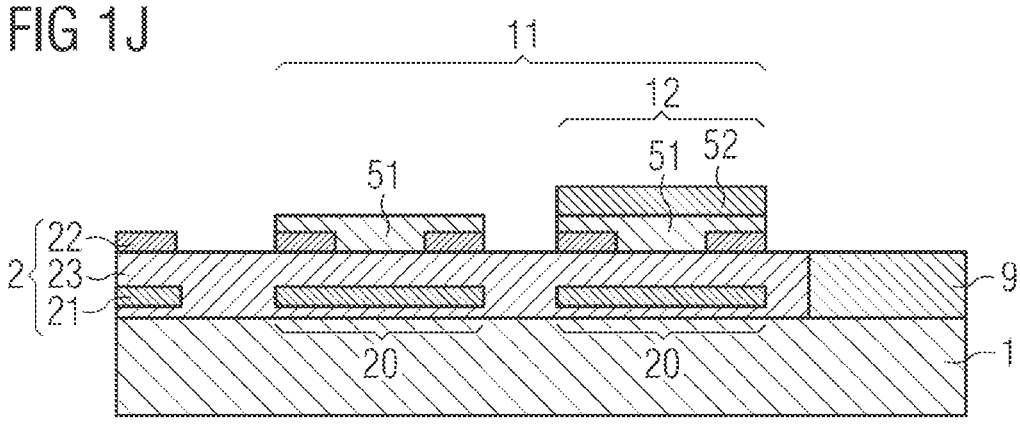
Figure 1K:
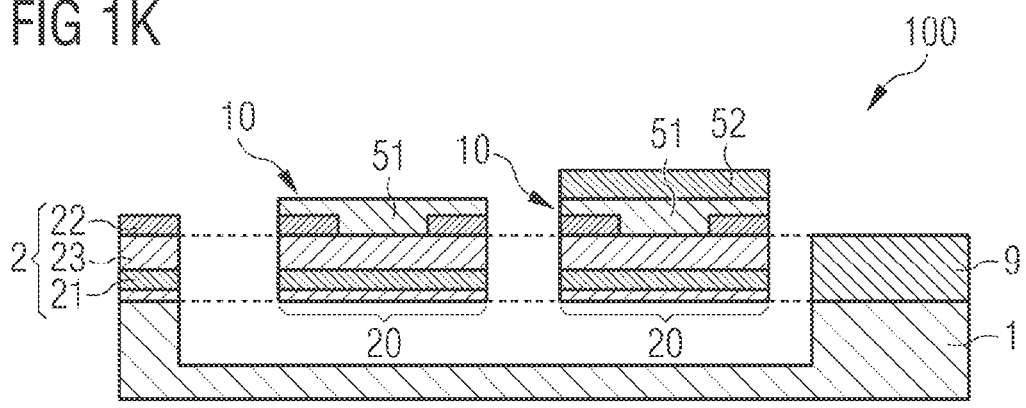

In connection with FIGS. 1A to 1K an embodiment for a method for manufacturing a sensor device 100 is illustrated. The sensor device 100, which is shown in FIG. 1K, comprises a plurality of sensor elements 10, which are embodied as gas sensors sensitive to different gas types.

In a method step A, as shown in FIG. 1A, a substrate 1 is provided with a functional layer 2. Here and in the following, only a part of the substrate 1 and the functional layer 2 is shown. The substrate 1 is preferably based on silicon or is made of silicon. In particular, the substrate 1 can be a wafer, so that the method described in the following can be used to manufacture a compound of a plurality of sensor devices in a wafer-based process. The compound can be singulated to separate the sensor devices from each other.

The electrical functional layer 2, or, in short, the functional layer 2, is preferably applied to the substrate 1 by using MEMS technology and comprises a plurality of functional regions 20. As shown in FIG. 1K, each of the functional regions 20 corresponds to an individual sensor element 10 of the finished sensor device 100. By way of example, only two functional regions 20 and, thus, only two sensor elements 10, are shown. However, the functional layer 2 preferably comprises more than two functional regions. Correspondingly, the finished sensor device comprises more than two sensor elements.

The functional layer 2 comprises a plurality of heater elements 21, wherein each of the heater elements 21 is assigned to a functional region 20. In the shown embodiment, every functional region 20 comprises its individually assigned heater element 21. As shown in FIG. 1B, it is also possible that the functional layer 2 comprises a common heater element 21 that is assigned to more than one functional region 20 or even to all functional regions 20. Although the following method steps are explained in connection with the embodiment of the functional layer 2 of FIG. 1A, the functional layer 2 can also be embodied as shown in FIG. 1B for the following method steps.

Each of the heater elements 21 is embodied as a heating resistance in the form of a heating layer, heating filament or heating wire. For instance, the heater elements 21 comprise or are made of a noble metal, for example Pt, and/or W. The functional regions 20 of the electric functional layer 2 are electrically addressable independently from each other by means of individually assigned electrical contacts 22. Preferably, also the heater elements 21 can be operated independently from each other or parallel or in series via suitable electrical contacts and/or conductor lines (not shown). The functional layer 2 further comprises a layer with or made of an electrically insulating material 23, for instance with or made of one or more oxides and/or nitrides as, for example, silicon oxide, silicon nitride and/or aluminum oxide. The heater elements 21 are preferably embedded in the electrically insulating material 23, whereas the electrical contacts 22, which are configured to electrically contact sensor material applied in a later method step, are arranged at least partly on the electrically insulating material 23.

Furthermore, the substrate 1 is provided with at least one electronic component 9 configured for addressing the functional regions 20 and, thus, the sensor elements 10 during operation of the sensor service 100. For instance, the electronic component 9 comprises at least one CMOS device. Alternatively, a plurality of electronic devices 9 can be arranged on the substrate 1. The at least one or more electronic devices 9 can form one or more ASICs (application-specific integrated circuit) or at least a part thereof for addressing and controlling the individual sensor elements 10 of the sensor device 100. The functional layer 2 can comprise for example conductor lines to connect the functional regions 20 to the at least one electronic component 9. Each of the at least one or more electronic devices 9 arranged on the substrate 1 can be embodied as a discrete component or as an integrated structure, which is manufactured, preferably by means of MEMS technology, on and/or in the substrate 1 and/or the functional layer 2. Since no high-temperature tempering step is needed in connection with the following method steps, it is possible to integrate the at least one electronic component 9 already at this stage of the method on and/or in the substrate 1 and/or the functional layer 2, so that an additional discrete electronic component that would be usually connected later to the sensor device by means of bonding-wire connections can be omitted. As such bonding-wire connections require a great amount of space, the integration of the at least one electronic device 9 can already lead to a miniaturization and simplification of the sensor device compared to usual sensors.

The plurality of functional regions 20 comprises at least a first group 11 of functional regions 20 and a second group 12 of functional regions 20, wherein the first group 11 is different from the second group 12. By way of example, both shown functional regions 20 belong to the first group 11, while only one of the functional regions 20 belongs to the second group. Consequently, at least one functional region 20 is part of the first group 11 and part of the second group 12, so that the first group 11 and the second group 12 have at least one functional region 20 in common and at least one other functional region 20 is only part of one of the first and second group 11, 12. As mentioned above, the functional layer 2 preferably comprises more than two functional regions 20, so that the functional layer 2 can comprise more functional regions 20 in the first group 11 and more functional regions 20 in the second group 12. Furthermore, the functional layer 2 can comprises for example more functional regions that are no part of the first group 11 or the second group 12 and/or functional regions that are only part of the first group 11 and/or functional regions that are only part of the second group 12.

In the following, a method step B is performed, which is a multiple-mask process using several masks. Each of the masks is related to one of the designated groups of the functional elements. As shown in FIG. 1C, a first mask material 31 is applied on the functional layer 2. The mask material 31 is preferably deposited as a continuous layer covering all of the functional layer 2 and the at least one electronic component 9. The first mask material 31, which can be a photoresist, is patterned, so that a first mask 41 is formed as shown in FIG. 1D. Alternatively, other mask materials can be used. The first mask 41 exposes the functional regions 20 of the first group 11 and covers all other functional regions (not shown). A first sensor material 51 is applied to the functional layer 2 as shown in FIG. 1E. Due to the first mask 41 the first sensor material 51 is applied only to the exposed functional regions 20, i.e., to the functional regions 20 of the first group 11. After removal of the first mask 41, as shown in FIG. 1F, only the functional regions 20 of the first group 11 are covered with the first sensor material 51.

As shown in FIG. 1G, similarly to the first mask material 31 a second mask material 32 is applied to the functional layer 2 and, thus, also onto the already deposited first sensor material 51. The second mask material 32 is patterned so that a second mask 42 is formed as shown in FIG. 1H. The second mask 42 exposes the functional regions 20 of the second group 12 and covers all other functional regions. A second sensor material 52 is applied to the functional layer 2 as shown in FIG. 1I. Due to the second mask 42 the second sensor material 52 is applied only to the exposed functional regions 20, i.e., to the functional regions 20 of the second group 12. After removal of the second mask 42, as shown in FIG. 1J, only the functional regions 20 of the second group 12 are provided with the second sensor material 52.

After deposition of the sensor materials 51, 52, the substrate 1 and/or the electrical functional layer 2, which is provided as a continuous layer on the substrate 1 in method step A, can be patterned in a method step C as shown in FIG. 1K. Preferably, at least a part of the electrical functional layer 2 can be formed as a membrane and the functional regions 20 can be separated from each other to form separated sensor elements 10. As described before, the patterning preferably performed by using process steps based on MEMS technology. In FIG. 1K, the dashed lines indicate parts of the functional layer 2 laterally adjacent to the sensor elements 10 which are needed to hold the sensor elements 10 and via which conductor lines can be lead from the at least one electronic component 9 to the sensor elements 10 for electrically individually addressing the sensor elements 10.

Both the first and second sensor materials 51, 52 are applied by sputtering, which for example provides, as explained above in the general part, the possibility to cover structures which are smaller than it is possible in connection with ink-based dispensing processes. The first and second sensor material 51, 52 are different, wherein each of the sensor materials 51, 52 comprises or consists of a semiconducting metal oxide such as, for instance, one or more selected from $SnO_x$, $WO_x$, $ZnO_x$, $TiO_x$, $CuO_x$. As explained above in the general part, differing sensor materials can provide different sensitivities to different gas types, i.e., to different molecule species and/or sizes. Furthermore, the combination of more than one sensor material in one functional region 20, as it is the case for the functional region 20 of the second group 12 in the shown embodiment, can provide a different sensitivity to certain gas types or gas molecules compared to either one of the sensor materials alone. For instance, it has been found by experiments that $SnO_x$ as sensor material can provide a higher sensitivity for detecting ethanol than for detecting aceton or salammoniac and $CuO_x$ as sensor material can provide a higher sensitivity for detecting aceton than for detecting ehtanol or salammoniac, whereas a combination of $SnO_x$ and $CuO_x$ sputtered thereon as combined sensor materials can provide a higher sensitivity for detecting salammoniac than for detecting ethanol or aceton. The change of the electrical resistance of the sensor materials 51, 52, which can be caused by certain gas types or gas molecules, can be measured as a sensor signal of each of the sensor elements 10 by means of the assigned electrical contacts 22.

In FIGS. 2A to 2F method steps of a method for manufacturing a sensor device 100 according to a further embodiment are illustrated, which is a variant of the method described in connection with the fore going embodiment. In particular, the method steps described in FIGS. 2A to 2F replace the method steps described in connection with FIGS. 1I to 1K. Consequently, the method steps described the connection with FIGS. 1A to 1H apply also to the embodiment of FIGS. 2A to 2F and are performed before the step shown in FIG. 2A.

Figure 2A:
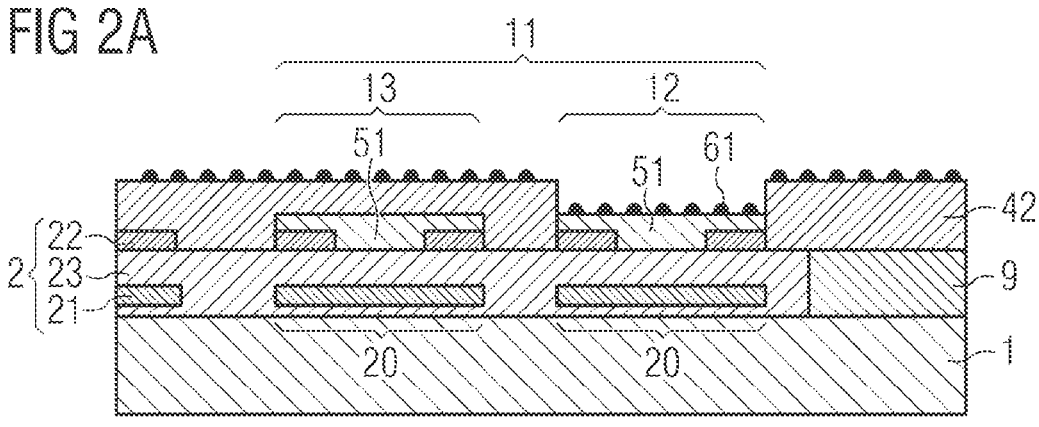
FIGS. 2A to 2F schematically illustrate method steps of a method for manufacturing a sensor device according to a further embodiment.

In particular, the functional layer 2 comprises a plurality of functional regions 20 with a first group 11 of functional regions 20 and a second group 12 of functional regions 20 as in the foregoing embodiment. Additionally, the functional layer 2 comprises a third group 13 of functional regions 20, wherein the third group 13 is different to the first and second groups 11, 12 and wherein at least one functional region 20 is part of the first group 11 and of the third group 13. Alternatively, at least one functional region 20 could also be part of the second and third groups 12, 13. As explained in connection with FIGS. 1A to 1H, a first sensor material 51 is applied to the functional regions 20 of the first group 11 by using a first mask. Afterwards, a second mask 42 is arranged on the functional layer 2, wherein the second mask 42 exposes the functional regions 20 of the second group 12 and covers all other functional regions 20. The second mask 42 is shown in FIG. 2A.

In contrast to the foregoing embodiment, a functionalizing treatment is performed in the exposed functional regions 20 of the second group 12. In the shown embodiment, a functionalizing material 61 is applied in form of a thin layer, for example by sputtering or evaporation, with a thickness of about 20 nm. Another thickness, as described in the general part, is also possible. The functionalizing material 61 is for instance a metal like Pt, Ag or Cu. As explained above in the general part, such thin layers tend to form clusters as indicated in FIG. 2A, wherein the cluster size and shape depend on the applied layer thickness. For instance, the functionalizing material 61 can act as a filter for gas molecules of a certain size and/or as a catalyst material. Consequently, the functionalizing material 61 changes the properties of the first sensor material 51 in the functional regions 20 of the second group 12 compared to the untreated first sensor material.

Figure 2B:
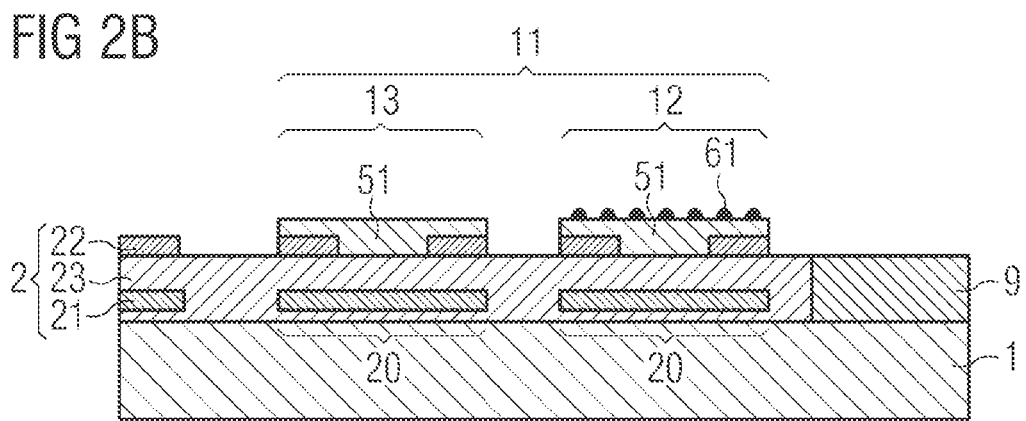
Figure 2C:
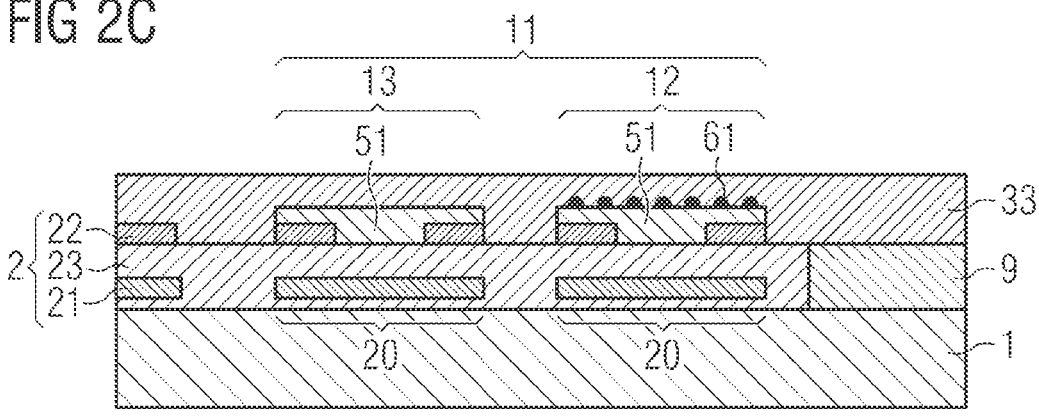

After removing the second mask 42, as shown in FIG. 2B, the patterning step explained in connection with FIG. 1K could be performed, thereby finishing the sensor device. However, in the shown embodiment a third mask material 33 is applied to the functional layer 2 and, thus, also onto the already deposited first sensor material 51 and the functionalizing material 61, as shown in FIG. 2C.

Figure 2D:
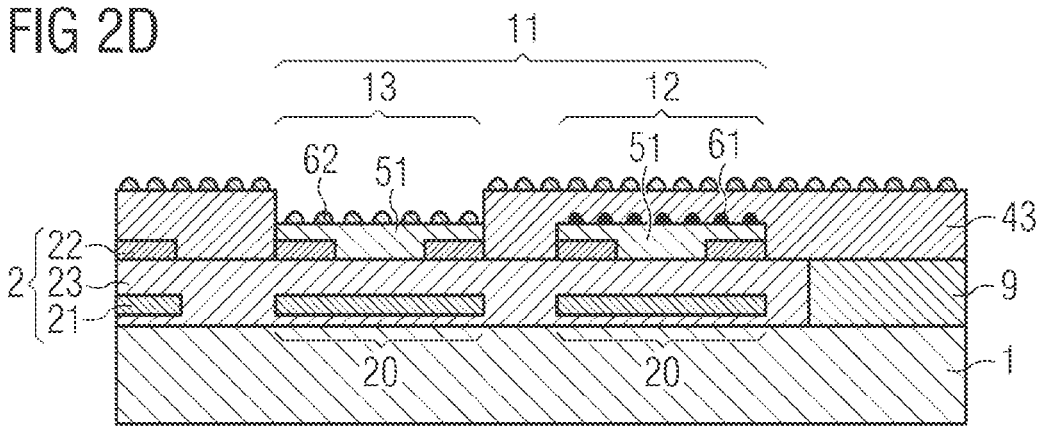
Figure 2E:
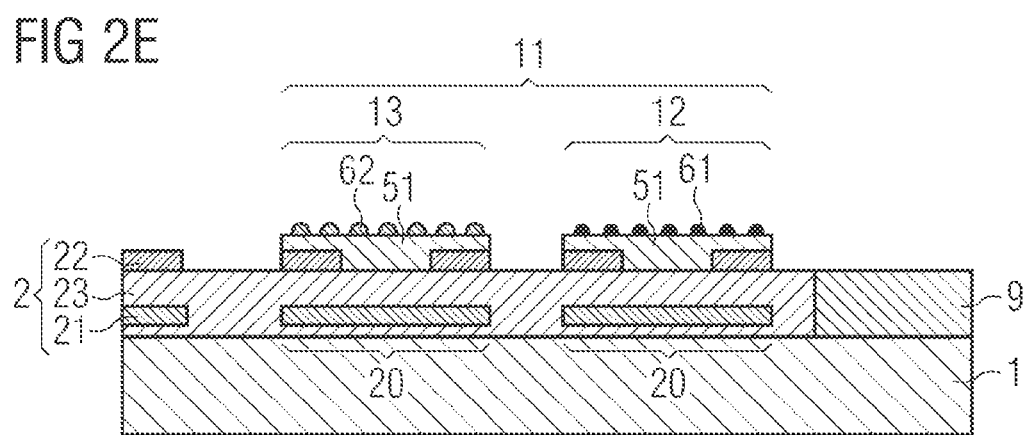
Figure 2F:
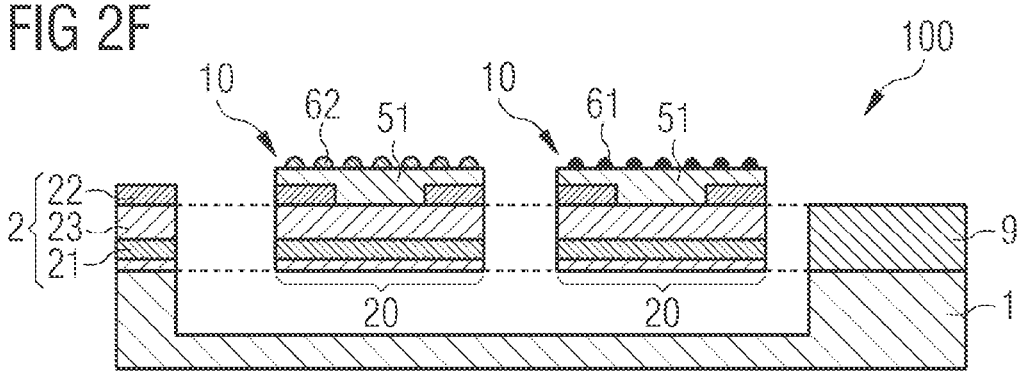

The third mask material 33 is patterned so that a third mask 43 is formed as shown in FIG. 2D. The third mask 43 exposes the functional regions 20 of the third group 13 and covers all other functional regions. As further shown in FIG. 2D, a further functionalizing treatment is performed in the exposed functional regions 20 of the third group 13. For instance, a further functionalizing material 62 can be applied, which differs from the functionalizing material 61 for instance in regard to the material and/or cluster size. Consequently, the further functionalizing material 62 changes the properties of the first sensor material 51 in a way different to the functionalizing material 61, so that after removal of the third mask 43, as shown in FIG. 2E, and after a patterning step corresponding to the method step described in connection with FIG. 1K, as shown in FIG. 2F, the sensor device 100 comprises sensor elements 10 which have different gas sensing properties.

Alternatively or additionally to applying a functionalizing material and/or catalyst material and/or filter material the functionalizing treatments can for example comprise performing a co-sputtering of a sensor material and a catalyst material and/or reactive sputtering and/or performing an oxidation step.

Additionally to the two or three groups of functional regions as described in connection with the foregoing embodiments, the plurality of functional regions can comprise one or more further groups, each of the further groups being different from all other groups. Preferably, in method step B, for each further group of the one or more further groups a further mask is applied on the electrical functional layer, the further mask exposing the functional regions of the further group and covering all other functional regions, a further sensor material is applied over the exposed functional regions of the further group by sputtering and/or a functionalizing treatment is performed in the exposed functional regions of the further group, and the further mask is removed. Preferably, at least one of the functional regions of at least one of the one or more further groups is part of another group. It can be shown that in the described method the number of manufactured different sensor elements forming different gas sensor types is exponentially growing with the number of masks used in method step B, so that at least for producing a sensor device with more than four sensor elements the described multiple-mask process is more effective than a process wherein for every sensor element an individual mask is used. In connection with FIGS. 3A to 3H method steps of a method for manufacturing a sensor device 100 with 56 different sensor elements 10 is explained, wherein only six masks are used in method step B. Every mask is assigned to a group of functional regions that is different to all other functional region, but wherein each pair of groups share at least one common functional region.

Figure 3A:
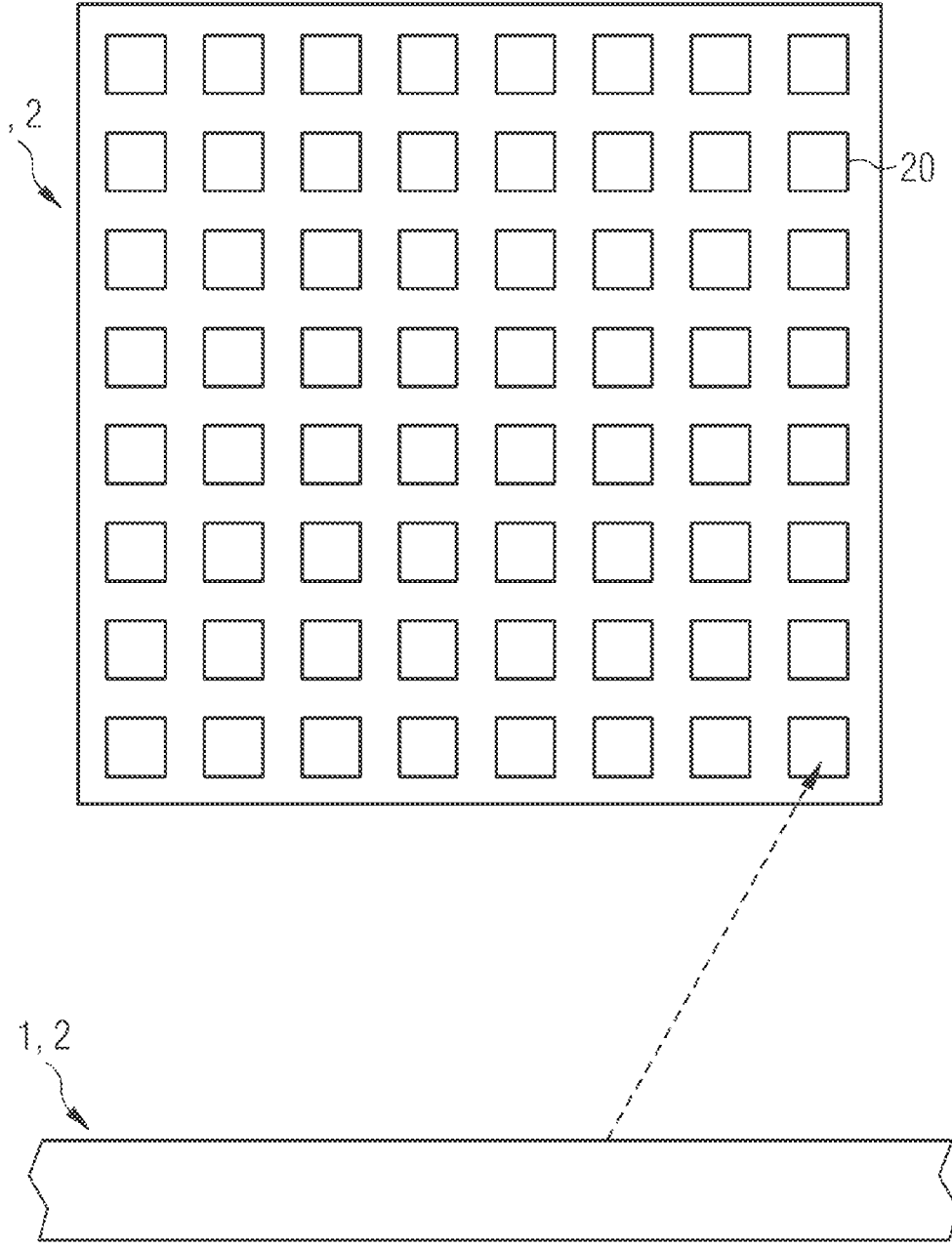
FIGS. 3A to 3H schematically illustrate method steps of a method for manufacturing a sensor device according to a further embodiment.

FIG. 3A shows in a top view and in a partial side view a substrate 1 with a functional layer 2 with 64 functional regions indicated by the 64 squares, wherein for the sake of clarity only one functional region is marked by the reference numeral 20. In the side view exemplary functional regions, marked by the arrows, are indicated. Also for the sake of clarity, the substrate 1 and the functional layer 2 are shown in a rather simplified view and can be embodied as described before. In particular, each of the functional regions has an individual heater element and electrical contacts to measure the electrical resistance of the sensor material(s) applied in the respective functional regions in the finished sensor device. Alternatively, the functional layer 2 can comprise a common heater element in the form of a common hot plate for all functional regions. In addition, the at least one electronic component 9 shown in the foregoing embodiments is omitted.

Figure 3B:
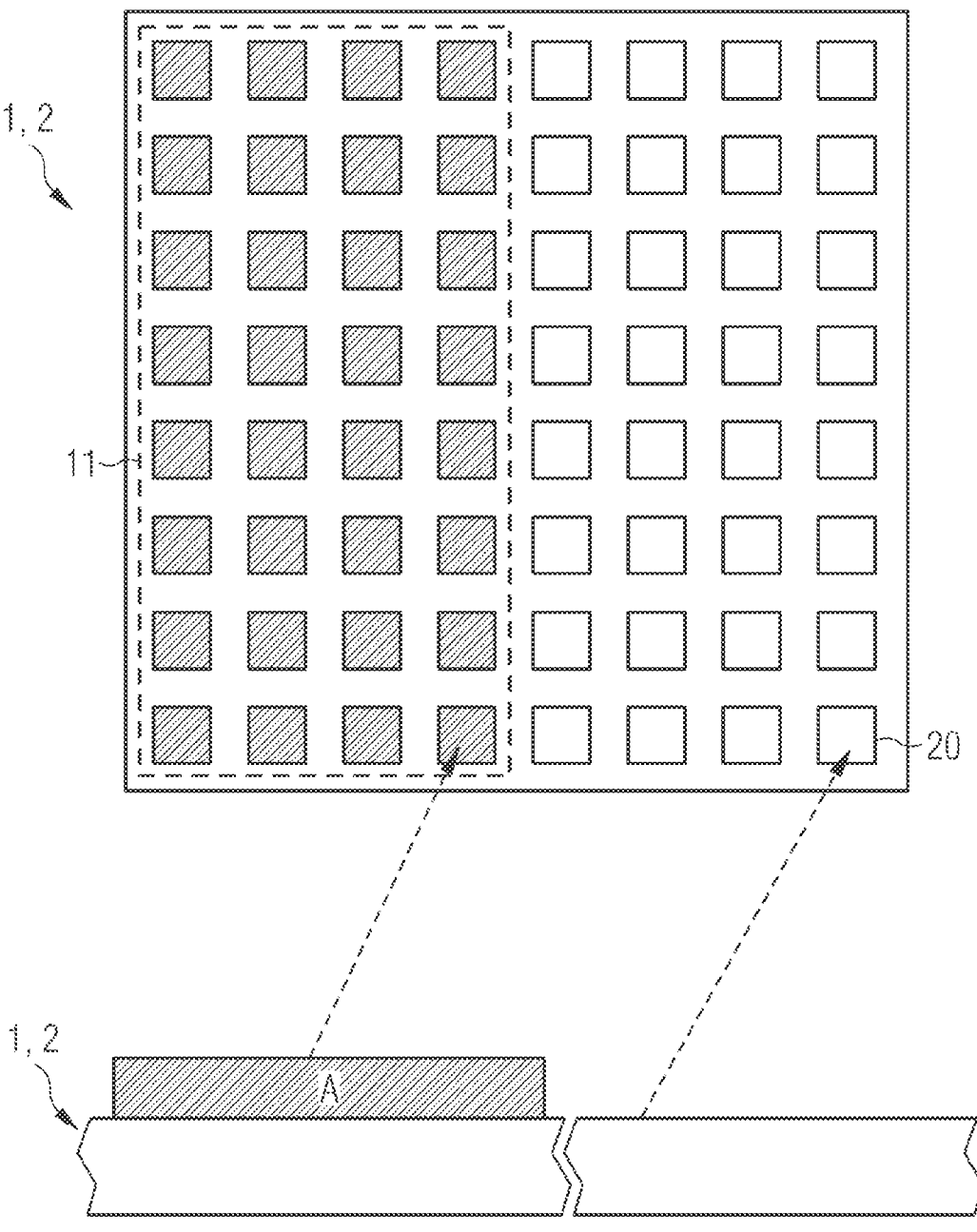

As shown in FIG. 3B, using a first mask a first sensor material is applied to a first group 11 of functional regions by sputtering. Here and in the following, the groups, which in the shown embodiment always include a half of the total number of functional regions, are indicated by the dashed rectangles in the top view. The first sensor material is formed by material denoted as "A" in the partial side view. After this step, the functional layer 2 comprises one half of the functional regions provided with the first sensor material and the other half of the functional regions free of any sensor material. By way of example, the material A forming the first sensor material can be very sensitive to an alcohol group as, for instance, methanol.

Figure 3C:
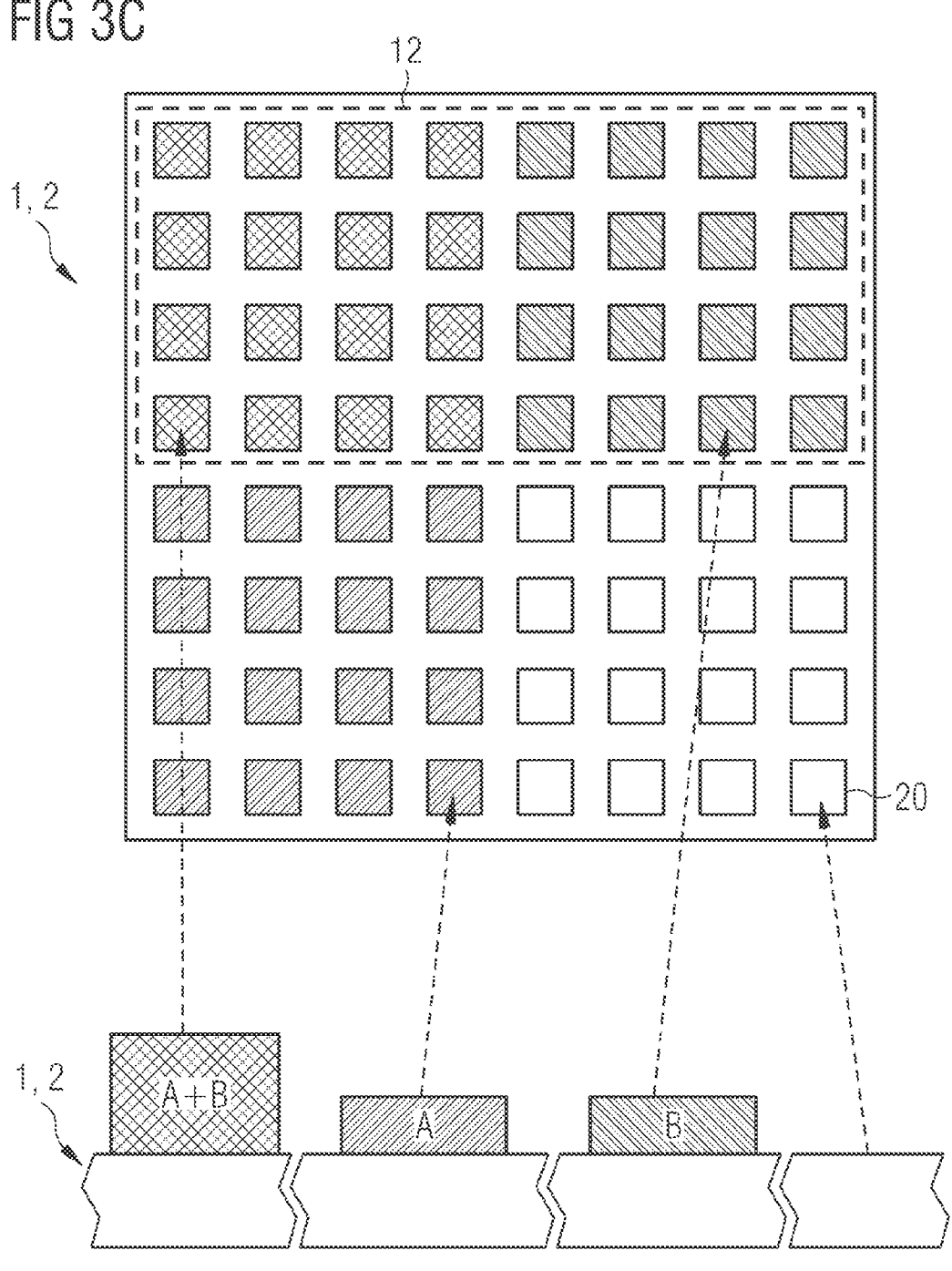

As shown in FIG. 3C, using a second mask a second sensor material is applied to a second group 12 of functional regions, wherein the second group 12 is different from the first group 11 as explained above, but shares a quarter of the functional regions with the first group 11. In the functional regions of the second group 12 a second sensor material is applied by sputtering. The second sensor material is a material denoted as "B" in the partial side view. By way of example, the material B used as second sensor material can be very sensitive to a ketone group as, for instance, methanol, which is part of formaldehyde. Consequently, the functional layer comprises a quarter of the functional regions provided with both materials A and B, denoted in the partial side view as "A+B", another quarter of the functional regions provided only with material A, another quarter of the functional regions provided with material B and the last quarter of the functional regions free of any sensor material. The mixture A+B of the sensor materials has in the shown example the highest sensitivity to molecules like methanonic acid, therefore it can help to distinguish such molecules. Depending on the sputtering parameters the sensor materials of the mixture A+B can diffuse more or less into each other. However, as long as gas molecules are able to get in contact with both sensor materials, the sensitivity of the mixture A+B is different to the unmixed sensor materials A and B, respectively. For example by a machine learning approach the sensor signals of such different sensor elements can be distinguished and interpreted.

Figure 3D:
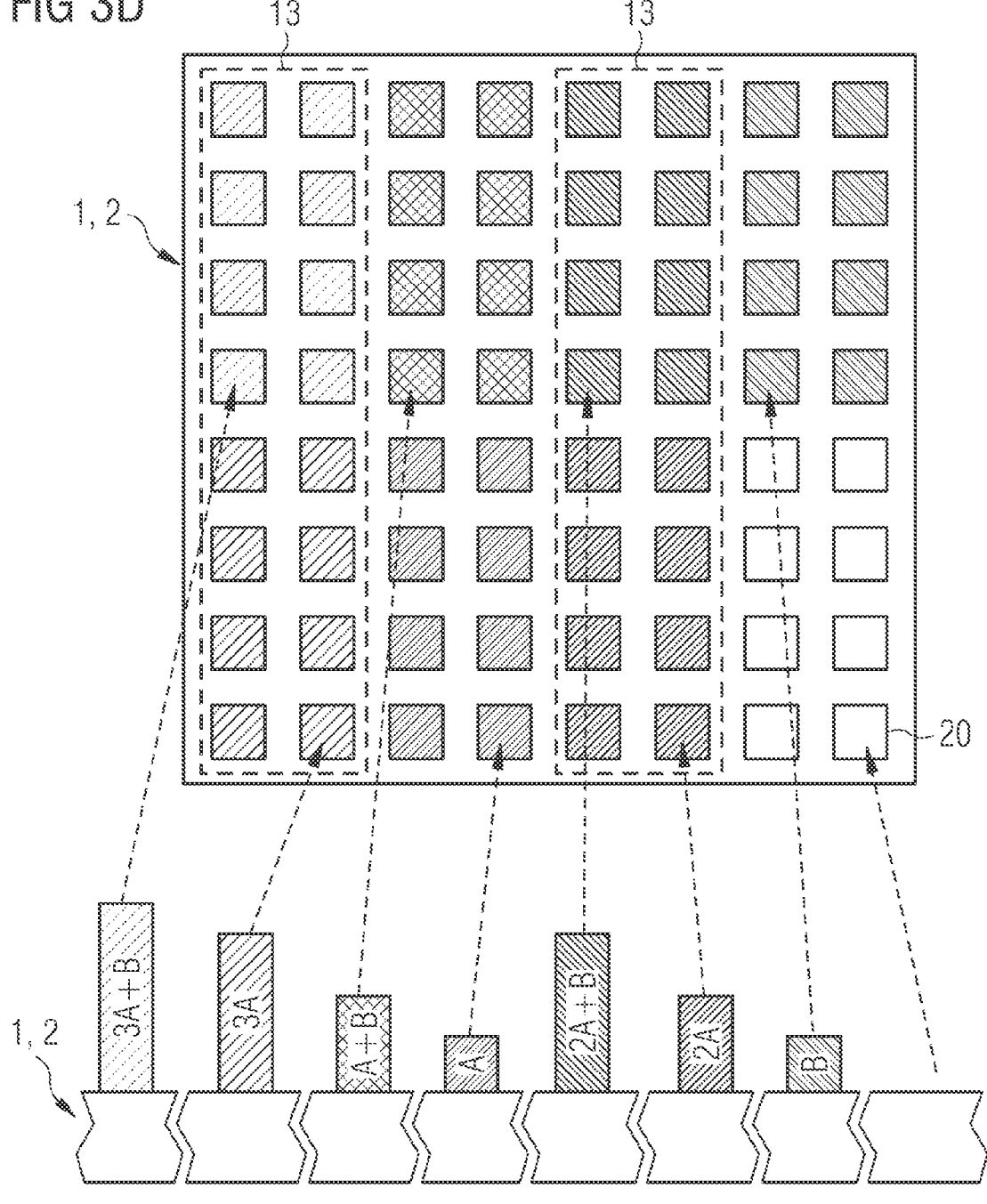

As shown in FIG. 3D, using a third mask a third sensor material is applied to a third group 13 of functional regions, wherein the third group 13 is different to both the first and second groups, but shares eight functional regions with each of the first group and the second group, respectively. The third sensor material comprises the same material A as the first sensor material, but is applied with a thickness which is twice the thickness of the first sensor material applied to the first group of functional regions. The layer thickness can be used to distinguish molecules by their activation energy, since a thicker layer can provide more time to interact and to reach the combustion temperature. For instance, CO with an autoignition temperature of 600° C. and formaldehyde with an autoignition temperature of 400° C. can be distinguished. Consequently, the functional layer 2 comprises seven different types of functional regions with the material mixtures 3A+B, 3A, 2A+B, 2A, and A+B, with the material A and with the material B, as well as one type of functional regions being free of any sensor material, as indicated in FIG. 3D.

Figure 3E:
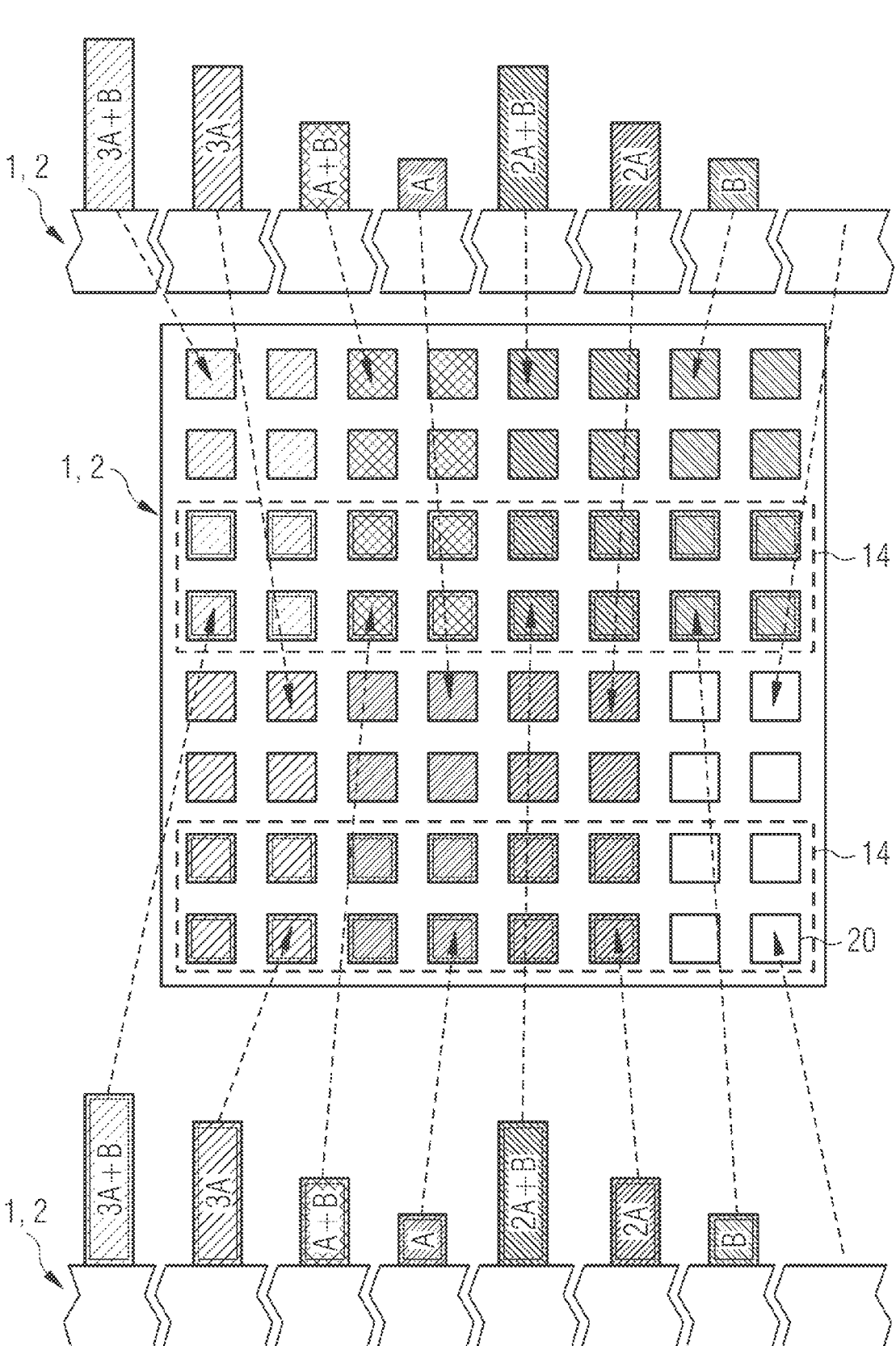

In a further step using a fourth mask, as shown in FIG. 3E, a functionalizing treatment is performed to a fourth group 14 of functional regions, wherein the fourth group 14 is different to any of the before-mentioned groups but shares functional regions with any of the before-mentioned groups. By way of example, the functionalizing treatment can be a surface treatment, for instance with an oxygen plasma. Such treatment can change the oxidation state and/or the roughness of the treated sensor materials, which can influence the selectivity to oxygen containing molecules. For instance in connection with $SnO_x$ as sensor material the functionalizing treatment can change the ratio of tin(II) oxide and tin(IV) oxide. As indicated in FIG. 3E, after the surface treatment the functional layer 2 comprises 14 different types of functional regions with the materials and material mixtures explained in connection with FIG. 3D in an untreated state and in a treated state, as well as eight functional regions 20 which are free of sensor material.

Figure 3F:
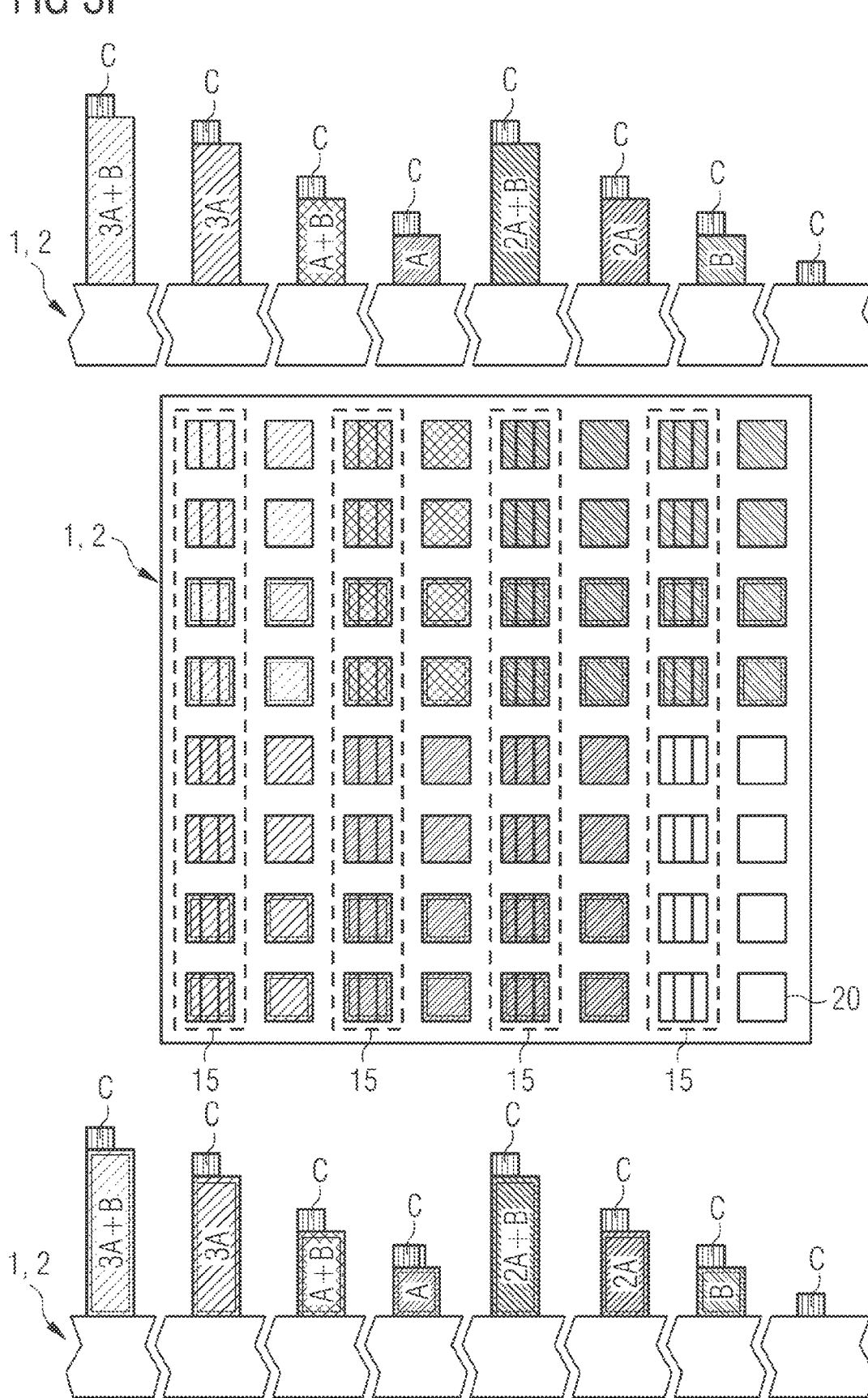

In a further step using a fifth mask, as shown in FIG. 3F, a further functionalizing treatment is performed to a fifth group 15 of functional regions, wherein the fifth group 15 is different to any of the before-mentioned groups but shares functional regions with any of the before-mentioned groups. By way of example, the further functionalizing treatment can be the deposition of a catalyst material. The catalyst material, which is applied to a half of the functional regions, is denoted as "C" in the partial side views. For reasons of clarity, in the side views the columns indicating the different materials and material mixtures as discussed before are provided with a catalyst material C which covers only half of the columns, respectively, in order to indicate that only half of the functional regions 20 are provided with the catalyst material, while the other half of the functional regions remain free of the catalyst material. By way of example, Pt can be used as catalyst material, which can increase the selectivity to hydrogen. Consequently, after the deposition of the catalyst material the functional layer 2 comprises 28 different types of functional regions with the untreated and treated materials and material mixtures explained in connection with FIG. 3E, now with and without a catalyst material, as well as eight functional regions 20 which are free of sensor material.

Figure 3G:
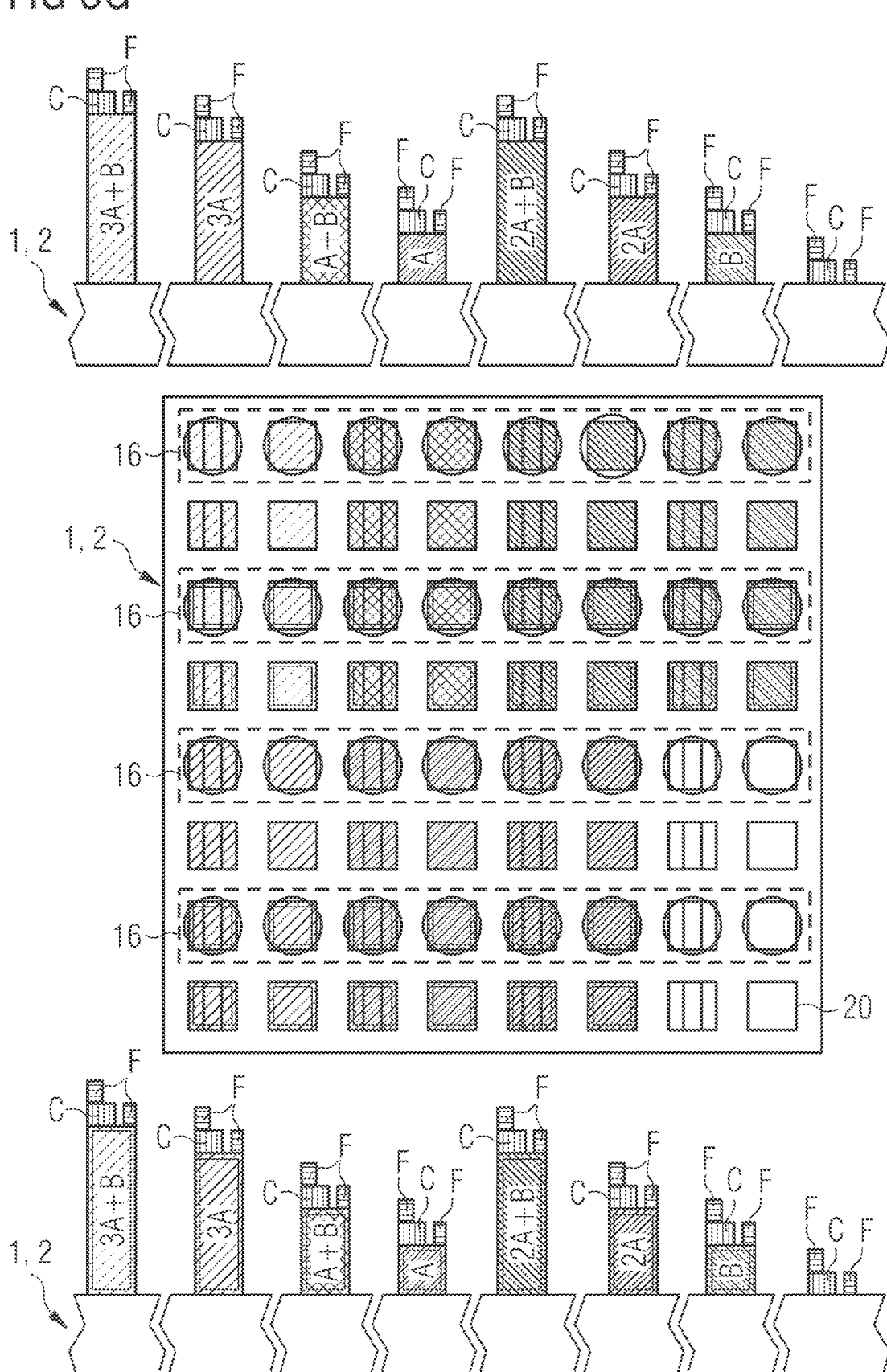

In a further step using a sixth mask, as shown in FIG. 3G, a further functionalizing treatment is performed to a sixth group 16 of functional regions, wherein the sixth group 16 is different to any of the before-mentioned groups but shares functional regions with any of the before-mentioned groups. By way of example, the further functionalizing treatment can be the deposition of a filter that lets pass only smaller molecules. For instance, a $SiO_2$ layer can be applied as filter layer that can decrease the selectivity to larger molecules and, thus, help to distinguish molecules by their chain length. For example, ethanol can be distinguished from pentanol by means of such filter. For reasons of clarity, in the side views the columns indicating the different materials and material mixtures as discussed before are provided with filter F which covers only two quarters of the columns, respectively, in order to indicate that only half of the functional regions 20 with a catalyst material and half of the functional regions 20 without the catalyst material are provided with the filter. Consequently, after the deposition of the filter the functional layer 2 comprises 56 different types of functional regions with the untreated and treated materials and material mixtures explained in connection with FIG. 3E with and without a catalyst material and with and without a filter, respectively, as well as eight functional regions 20 which are free of sensor material.

Figure 3H:
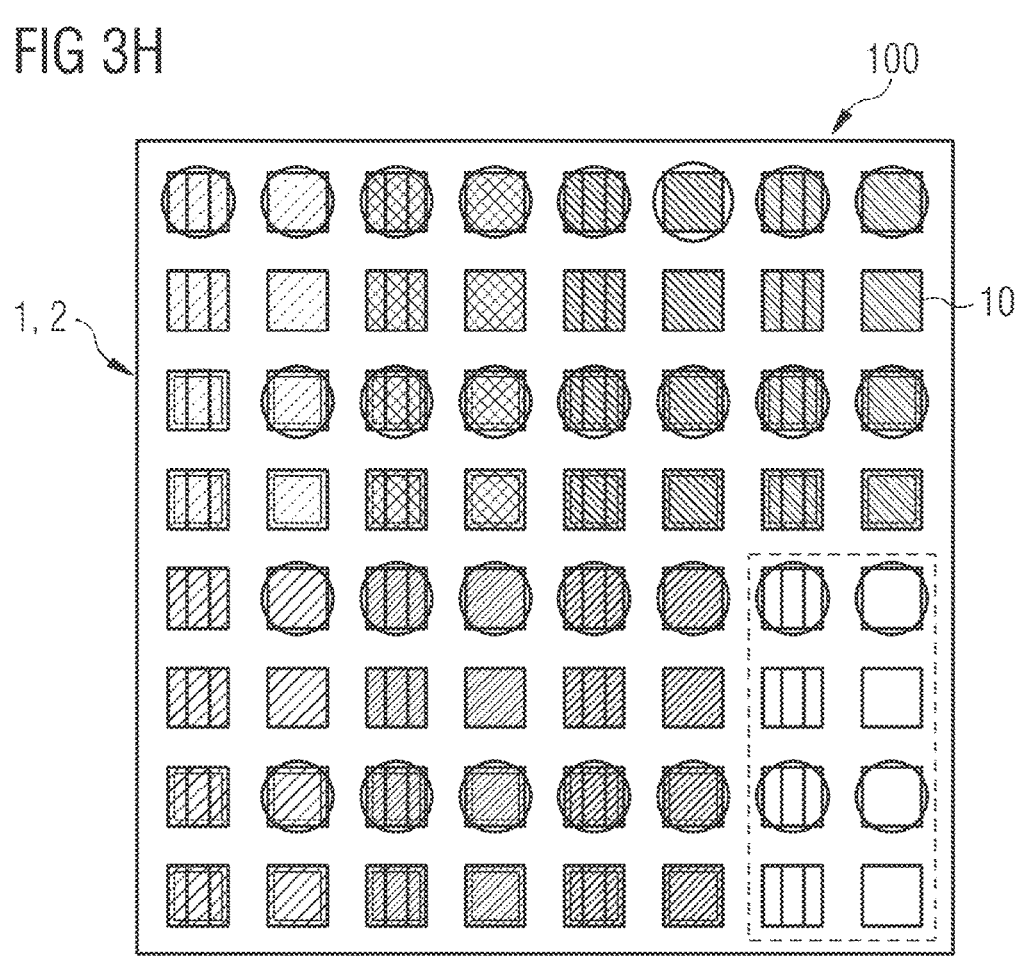

In a next method step C, the functional layer 2 can be formed at least partly as membrane as described before in connection with FIG. 1K, so that the sensor device 100, which is indicated in FIG. 3H, comprises 56 different sensor elements 10 forming 56 different pixels, which are produced by using only six mask-based deposition or treatment steps. Each individual sensor element 10 can help to separate gas species by their chemical and physical fingerprint. For instance by using suitable algorithms or a neuronal network approach the measurement signal of each of the sensor elements 10 can be used to distinguish different gases. Since each pixel is different, every pixel improves the gas detection ability of the sensor device 100. It can be easily understood that with a suitable choice of groups of functional regions in connection with method step B the number of different pixels, i.e., the number of different sensor elements can be approximately proportional to $2^n$, wherein n is the number of mask-based deposition and treatment steps in method step B. Consequently, using more mask-based deposition and treatment steps in method step B can drastically increase the number of sensor elements 10. For instance, using eight mask-based deposition and treatment steps in method step B, which can still be feasible compared to ink-based dispensing methods according to the state of the art, can lead to about 250 different sensor elements, which is approximately the number of different olfactory cells in the human nose.

In particular, the described method bears very low risks compared to known technologies. For example, the process conditions are very relaxed because for instance a neuronal network can automatically compensate process fluctuations. Furthermore, no special process development is needed, since, as long as there are differences in the sensors elements, there is enough information provided by the sensor device to separate different gases.

Figure 4A:
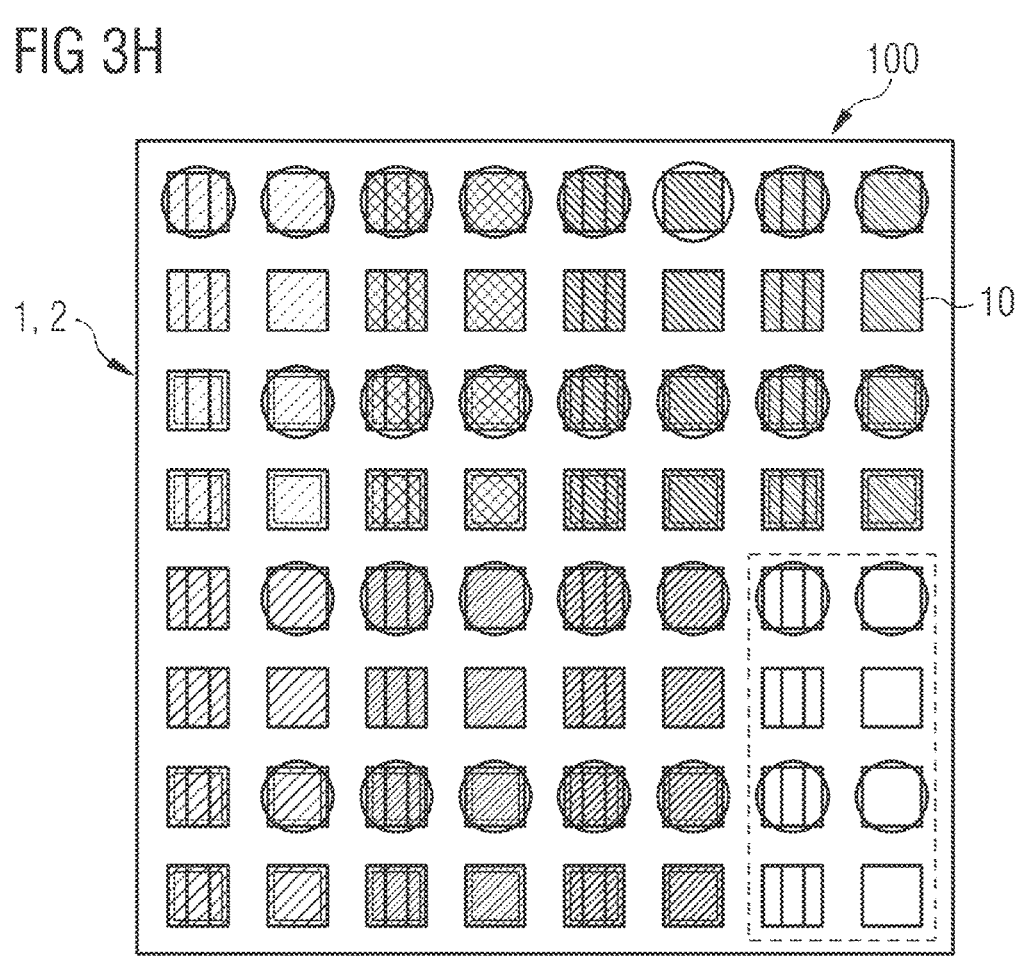
FIGS. 4A to 4C show measurements performed with sensor elements of an exemplary sensor device.
Figure 4B:
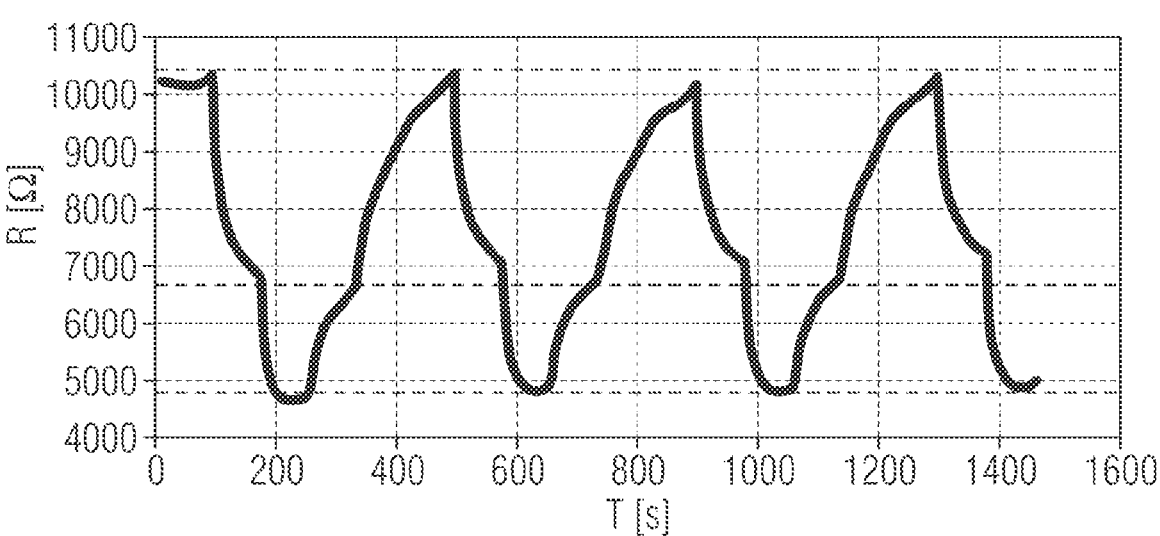
Figure 4C:
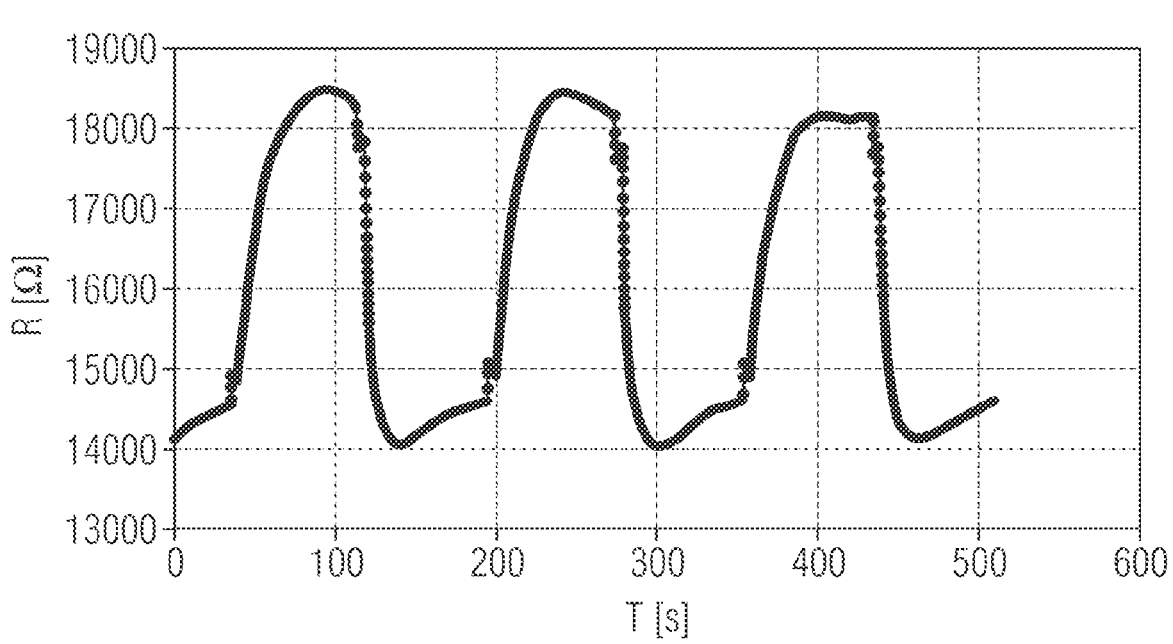

FIGS. 4A to 4C show measurements performed with sensor elements of an exemplary sensor device. In FIG. 4A the electrical resistance R of a sensor element at a temperature of 300° C. is shown which is sensitive to ethanol, while during time T the ethanol concentration was varied between a certain maximum ethanol concentration in air, leading to the global minima marked by the lower dashed line, half the maximum ethanol concentration, marked by the middle dashed line, and clean air, marked by the upper dashed line. FIG. 4B shows a similar measurement with a sensor element sensitive to acetone, while FIG. 4C shows a similar measurement with a sensor element sensitive to ammonia. It can be easily seen that the sensor elements provided very stable signals with an excellent repeatability.

Alternatively or additionally to the features described in connection with the figures, the embodiments shown in the figures can comprise further features described in the general part of the description. Moreover, features and embodiments of the figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A method for manufacturing a sensor device comprising at least one sensor material, the method comprising:

providing a substrate with an electrical functional layer comprising a plurality of functional regions, wherein each of the functional regions is electrically address-able independently from each other by individually assigned electrical contacts, wherein the plurality of functional regions comprises at least a first group of functional regions and a second group of functional regions, wherein the first group is different from the second group, and wherein at least one functional region is part of the first group and of the second group; and performing a multiple-mask process by:

applying a first mask on the electrical functional layer, wherein the first mask exposes the functional regions of the first group and covers all other functional regions;

applying a first sensor material over the exposed functional regions and over the individually assigned electrical contacts by sputtering;

removing the first mask;

applying a second mask on the electrical functional layer, wherein the second mask exposes the functional regions of the second group and covers all other functional regions;

applying a second sensor material over the exposed functional regions by sputtering and/or performing a functionalizing treatment in the exposed functional regions; and removing the second mask, wherein the sensor device is a gas sensor, and wherein different functional regions represent different gas sensor types.

2. The method according to claim 1, wherein the plurality of functional regions comprises at least a third group of functional regions, the third group being different from the first group and the second group, and wherein performing the multiple-mask process further comprises applying a third mask on the electrical functional layer, the third mask exposing the functional regions of the third group and covering all other functional regions, applying a third sensor material over the exposed functional regions by sputtering and/or a functionalizing treatment is performed in the exposed functional regions, and removing the third mask.

3. The method according to claim 2, wherein at least one of the functional regions of the third group is part of the first group and/or at least one of the functional regions of the third group is part of the second group.

4. The method according to claim 1, wherein the plurality of functional regions comprises one or more further groups, each of the further groups being different from all other groups, and wherein, for each further group of the one or more further groups, performing the multiple-mask process comprises applying a further mask on the electrical functional layer, the further mask exposing the functional regions of the further group and covering all other functional regions, applying a further sensor material over the exposed functional regions by sputtering and/or by performing a functionalizing treatment in the exposed functional regions, and removing the further mask.

5. The method according to claim 4, wherein at least one of the functional regions of at least one of the one or more further groups is part of another group.

6. The method according to claim 1, wherein the sensor materials are different from each other in regard to material and/or amount.

7. The method according to claim 1, wherein the at least one sensor material comprises a semiconducting metal oxide.

8. The method according to claim 1, wherein performing the functionalizing treatment comprises one or more of providing a functionalizing material, providing a catalyst material, providing a filter material, performing reactive sputtering, or performing an oxidation.

9. The method according to claim 8, wherein the functionalizing material comprises at least one metal selected from Pt, Cu or Ag.

10. The method according to claim 8, wherein the catalyst material is provided by sputtering or by co-sputtering in combination with a sensor material.

11. The method according to claim 8, wherein performing the oxidation comprises performing plasma-oxidation and/or heat-induced oxidation.

12. The method according to claim 1, wherein the electrical functional layer comprises a plurality of heater elements, and wherein each of the heater elements is assigned to a functional region.

13. The method according to claim 1, wherein the electrical functional layer comprises a common heater element that is assigned to all functional regions.

14. The method according to claim 1, wherein the electrical functional layer is provided as a continuous layer on the substrate, and wherein the substrate and/or the electrical functional layer is patterned after performing the multiple-mask process.

15. The method according to claim 14, wherein at least a part of the electrical functional layer is formed as a membrane after performing the multiple-mask process.

16. The method according to claim 1, wherein the electrical functional layer is manufactured and/or patterned using MEMS technology.

17. The method according to claim 1, wherein, before performing the multiple-mask process, the substrate is provided with at least one electronic component for addressing the functional regions during operation of the sensor device.

18. The method according to claim 17, wherein the at least one electronic component comprises at least one CMOS device.

19. The method according to claim 17, wherein performing the multiple-mask process comprises covering the electronic component by at least one or more or all of the masks applied on a functional layer of the electronic component.

20. A method for manufacturing a sensor device comprising at least one sensor material, the method comprising:

providing a substrate with an electrical functional layer comprising a plurality of functional regions, wherein each of the functional regions is electrically address-able independently from each other by individually assigned electrical contacts, wherein the plurality of functional regions comprises at least a first group of functional regions and a second group of functional regions, wherein the first group is different from the second group, and wherein at least one functional region is part of the first group and of the second group; and performing a multiple-mask process by:

applying a first mask on the electrical functional layer, wherein the first mask exposes the functional regions of the first group and covers all other functional regions;

applying a first sensor material over the exposed functional regions and over the individually assigned electrical contacts by sputtering;

removing the first mask;

applying a second mask on the electrical functional layer, wherein the second mask exposes the functional regions of the second group and covers all other functional regions;

applying a second sensor material over the exposed functional regions by sputtering and/or performing a functionalizing treatment in the exposed functional regions; and removing the second mask, wherein the electrical functional layer comprises a layer including an electrically insulating material and at least one heater element embedded in the electrically insulating material, wherein the electrical contacts are disposed at least partly on the electrically insulating material as seen from the substrate, wherein the sensor device is a gas sensor, and wherein different functional regions represent different gas sensor types.

\* \* \* \* \*